(12) United States Patent
Heo

(10) Patent No.: US 11,063,096 B2
(45) Date of Patent: Jul. 13, 2021

(54) ORGANIC LIGHT EMITTING DIODE DISPLAY DEVICE

(71) Applicant: LG DISPLAY CO., LTD., Seoul (KR)

(72) Inventor: Joonyoung Heo, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 24 days.

(21) Appl. No.: 16/141,354

(22) Filed: Sep. 25, 2018

(65) Prior Publication Data

US 2019/0103450 A1 Apr. 4, 2019

(30) Foreign Application Priority Data

Sep. 29, 2017 (KR) ........................ 10-2017-0128233

(51) Int. Cl.
*H01L 27/32* (2006.01)
*H01L 51/50* (2006.01)
*H01L 51/52* (2006.01)
*G09G 3/3291* (2016.01)

(52) U.S. Cl.
CPC ....... *H01L 27/3246* (2013.01); *G09G 3/3291* (2013.01); *H01L 27/322* (2013.01); *H01L 27/3211* (2013.01); *H01L 51/5012* (2013.01); *H01L 51/5056* (2013.01); *H01L 51/5072* (2013.01); *H01L 51/5092* (2013.01); *H01L 51/5206* (2013.01); *H01L 51/5221* (2013.01); *H01L 51/5225* (2013.01)

(58) Field of Classification Search
CPC ............. H01L 27/3246; H01L 51/5012; H01L 51/5072; H01L 51/5092; H01L 51/5206; H01L 51/5221; H01L 51/5056; H01L 51/5225
See application file for complete search history.

(56) References Cited

U.S. PATENT DOCUMENTS

| 2010/0033084 | A1* | 2/2010 | Ko | ........................ | H01L 27/3246 313/504 |
| 2012/0043565 | A1* | 2/2012 | Sagawa | .................. | H01L 33/502 257/89 |
| 2012/0313844 | A1* | 12/2012 | Im | ........................ | H01L 27/3218 345/76 |
| 2013/0001620 | A1* | 1/2013 | Sugisawa | ............ | H01L 27/3276 257/98 |
| 2018/0301521 | A1* | 10/2018 | Yang | .................... | H01L 27/3211 |
| 2019/0006443 | A1* | 1/2019 | Hanashima | ......... | H01L 27/3246 |

FOREIGN PATENT DOCUMENTS

| JP | 2011-165563 A | 6/2011 |
| JP | 2013-206738 A | 10/2013 |
| KR | 10-2004-0025363 A | 3/2004 |
| KR | 10-2008-0065933 A | 7/2008 |

(Continued)

*Primary Examiner* — Jesse Y Miyoshi
(74) *Attorney, Agent, or Firm* — Birch, Stewart, Kolasch & Birch, LLP

(57) ABSTRACT

An organic light emitting diode display device is discussed. The organic light emitting diode display device includes pixels including an organic light emitting diode, and a bank partitioning the pixels which are neighboring, and having openings exposing at least a portion of a first electrode of the organic light emitting diode allocated for each of the pixels. The bank includes at least one groove provided between the neighboring pixels in at least one area.

11 Claims, 11 Drawing Sheets

(56) References Cited

FOREIGN PATENT DOCUMENTS

| KR | 10-2015-0003567 A | 1/2015 |
|----|-------------------|--------|
| KR | 10-2015-0017812 A | 2/2015 |
| KR | 10-2015-0075135 A | 7/2015 |
| KR | 10-2016-0064867 A | 5/2016 |
| KR | 10-2018-0149599 A | 12/2018 |

* cited by examiner (a)

(b)

ORGANIC LIGHT EMITTING DIODE DISPLAY DEVICE

This application claims the priority benefit of Korean Patent Application No. 10-2017-0128233 filed in the Republic of Korea on Sep. 29, 2017, the entire contents of which is incorporated herein by reference for all purposes as if fully set forth herein.

BACKGROUND OF THE INVENTION

Field of the Invention

The present disclosure relates to an organic light emitting diode display device.

Discussion of the Related Art

Various display devices capable of reducing weight and volume, which are disadvantages of cathode ray tubes, have been developed. The display devices can be implemented as a liquid crystal display (LCD), a field emission display (FED), a plasma display panel (PDP), an electroluminescent display, an organic light emitting diode display device, and the like.

Among these display devices, the organic light emitting diode display device is a self-emission type display device which excites an organic compound to emit light. The organic light emitting diode display device has advantages of being light and thin and simplifying the process because the backlight used in the LCD is not required. In addition, the organic light emitting diode display device is widely used because it has characteristics such as low-temperature production, high response speed as response speed of less than 1ms, low power consumption, wide viewing angle and high contrast.

The organic light emitting diode display device includes an organic light emitting diode (OLED) for converting electrical energy into light energy. The organic light emitting diode includes an anode, a cathode, and an organic light emitting layer disposed therebetween. In the organic light emitting diode display device, holes and electrons injected from the anode and the cathode, respectively, are combined in the organic light emitting layer to form excitons. The formed excitons emit light while falling from an excited state to a ground state and display an image.

The organic light emitting layer can include red (R), green (G) and blue (B) organic light emitting layers and they can be formed in corresponding red (R), green (G) and blue (B) pixels, respectively. For such patterning of the red (R), green (G), and blue (B) pixels, a fine metal mask (FMM) is generally used. However, despite the breakthrough in process technology, there is a limitation in using the FMM mask to implement a high-resolution display device. Actually, when the FMM mask is used to implement a resolution of 1000 PPI (pixel per inch) or more, it is difficult to secure a process yield higher than a certain level.

Further, in order to implement a large-area high-resolution display device, a large-area FMM mask corresponding thereto is required. However, as an area of the mask increases, a phenomenon that a center of the mask sags due to the weight of the mask occurs, and various defects such as failure of forming the organic light emitting layer in place are caused.

SUMMARY OF THE INVENTION

The present disclosure provides an organic light emitting diode display device having improved display quality by minimizing a leakage current.

In one aspect, there is provided an organic light emitting diode display device including pixels including an organic light emitting diode, and a bank partitioning the pixels which are neighboring, and having openings exposing at least a portion of a first electrode of the organic light emitting diode allocated for each of the pixels. The bank includes one or more grooves provided between the neighboring pixels in at least one area.

Each of the one or more grooves can have either a hole shape that completely penetrates an entire thickness of the bank or a recess shape that is partially recessed inward from an upper surface of the bank.

In one example, a plurality of the grooves are provided. The plurality of grooves can be disposed along one direction between the neighboring pixels in that one direction.

The grooves can include a first groove disposed between neighboring pixels in a first area, and a second groove disposed between neighboring pixels in a second area. The first groove and the second groove can be separated from each other.

The first groove can be disposed between pixels neighboring in a first direction. The second groove can be disposed between pixels neighboring in a second direction that intersects with the first direction.

The first area and the second area can be areas divided in a first direction between pixels neighboring in a second direction intersecting the first direction.

The organic light emitting diode can include an organic light emitting layer covering the pixels and a second electrode covering the organic light emitting layer. The organic light emitting layer and the second electrode can include at least one area physically separated by the one or more grooves.

A part of the organic light emitting layer and the second electrode physically separated by the one or more grooves can remain in the groove.

A shape of each groove can be defined by a bottom surface and two sides extending from both ends of the bottom surface. An angle between the bottom surface and one of the sides can be an acute angle.

The second electrode can include a connection area which is not physically separated by the one or more grooves and continues in continuity.

The pixels can include a first pixel emitting a first color and a second pixel neighboring the first pixel and emitting the first color. The one or more grooves can be not disposed between the first pixel and the second pixel.

In another example, the pixels can include a first pixel, a second pixel neighboring the first pixel in a first direction, and spaced apart from the first pixel by a first distance, and a third pixel neighboring the first pixel in a second direction intersecting with the first direction, and spaced apart from the first pixel by a second distance shorter than the first distance. A number of grooves disposed between the first pixel and the second pixel can be smaller than a number of grooves disposed between the first pixel and the third pixel.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
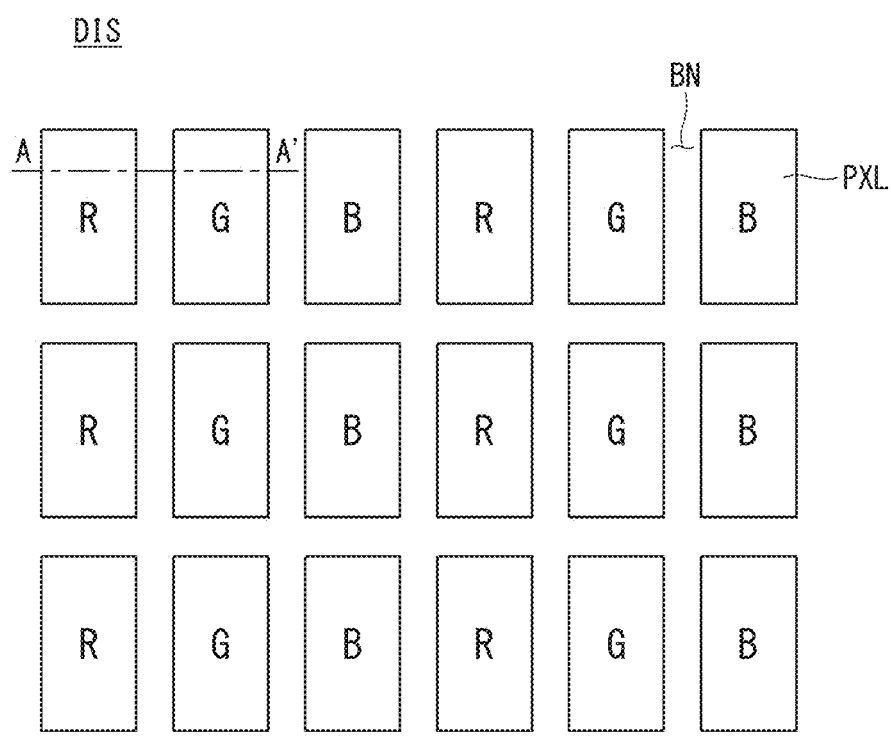
FIG. 1 and FIG. 2 are a plan view and a cross-sectional view schematically showing an organic light emitting diode display device, respectively, according to an embodiment of the present disclosure.

Hereinafter, preferred embodiments of the present disclosure will be described with reference to the accompanying drawings. Like reference numerals designate like elements throughout the description. In the following description, when a detailed description of well-known functions or configurations related to this document is determined to unnecessarily cloud a gist of the invention, the detailed description thereof will be omitted. In describing the various embodiments, the same components can be described at the outset and can be omitted in other embodiments.

The terms "first", "second", etc. can be used to describe various components, but the components are not limited by such terms. These terms are only used to distinguish one component from another component.

Figure 2:
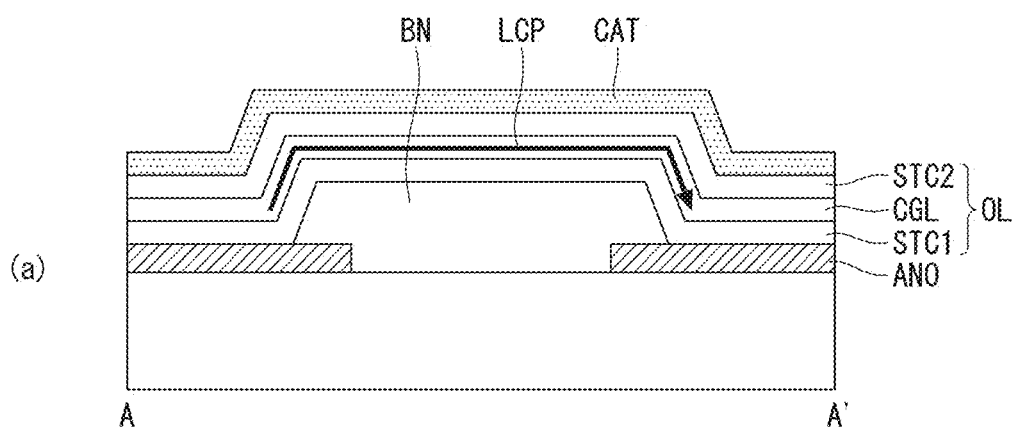
Figure 2:
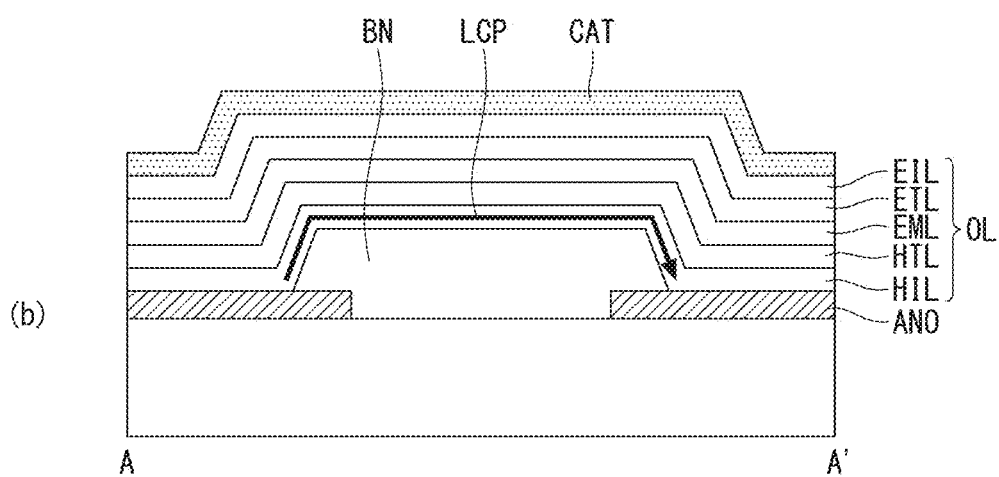

FIG. 1 and FIG. 2 are a plan view and a cross-sectional view schematically showing an organic light emitting diode display device according to an embodiment of the present invention. Particularly, FIG. 2 shows a cross-sectional view along line A-A' of FIG. 1. All the components of the organic light emitting diode display device according to all embodiments of the present invention are operatively coupled and configured.

Referring to FIGS. 1 and 2, the organic light emitting diode display device includes a display panel DIS having a plurality of pixels PXL. The display panel DIS can have various shapes. For example, the display panel DIS can have a rectangular shape, a square shape, or various free forms such as a circle, an ellipse, or a polygon.

The display panel DIS includes red R, blue B, and green G pixels PXL for emitting red R, blue B, and green G, respectively. If necessary, the display panel DIS can further include a pixel PXL that emits a different color such as white W. Hereinafter, for convenience of explanation, a case where the display panel DIS includes red R, blue B, and green G pixels PXL will be described as an example.

The organic light emitting diode display device according to the present disclosure includes an organic light emitting layer OL for emitting white W and color filters for red R, blue B, and green G to implement red R, green G, and blue B. That is, in the organic light emitting diode display device, the white W light emitted from the organic light emitting layer OL passes through the color filters for red R, green G, and blue B, respectively, provided in areas corresponding to the red R, green G, and blue B pixels PXL, so that it can implement red R, green G, and blue B.

In the organic light emitting diode display device according to an example of the present disclosure, since it is sufficient to form the organic light emitting layer OL which emits white W so as to cover most of an entire surface of the panel, it is not necessary to use an FMM mask to allocate each of the organic light emitting layers OL of red R, blue B, and green G within the corresponding pixels PXL. Therefore, the present disclosure has an advantage of preventing problems, for example, when a high resolution is implemented, a process yield is decreased, and the organic light emitting layer OL is not aligned, caused by using the FMM described above.

By using the above-described method, the present disclosure can implement a display device having a high resolution while minimizing lowering in the process yield. However, due to a leakage current through the organic light emitting layer OL, light from an undesired pixel PXL can be emitted and color mixture can occur between neighboring pixels PXL. Here, at least one of layers constituting the organic light emitting layer OL having high conductivity can be a flow path of the leakage current (LCP, FIG. 2).

For example, referring to (a) of FIG. 2, the organic light emitting layer OL that emits white W can have a multi-stack structure such as a two-stack structure. The two-stack structure can include a charge generation layer CGL disposed between a first electrode ANO and a second electrode CAT, and a first stack STC1 and a second stack STC2 disposed below and above the charge generation layer CGL with the charge generation layer CGL interposed therebetween. Hereinafter, a case where the first electrode ANO is an anode and the second electrode CAT is a cathode will be described as an example, but the present disclosure is not limited thereto. That is, an organic light emitting diode can be implemented in an inverted structure.

Each of the first stack STC1 and the second stack STC2 includes an emission layer and can further include at least one of common layers such as a hole injection layer, a hole transport layer, an electron transport layer, and an electron injection layer. The emission layer of the first stack STC1 and the emission layer of the second stack STC2 can include light emitting materials of different colors from each other. Either the emission layer of the first stack STC1 or the emission layer of the second stack STC2 can include a blue light emitting material and the other can include a yellow light emitting material. However, the present disclosure is not limited thereto.

Since the above-described organic light emitting layer OL, in particular, the charge generation layer CGL is widely formed so as to cover all the pixels without being patterned for each pixel PXL, some current generated when the display device maintains turn ON-state can be leaked through the charge generation layer CGL. There arises a problem that a color gamut (or color reproduction range) is significantly decreased as the light is emitted from the pixel PXL in which light emission is not required due to the leakage current.

As another example, referring to (b) of FIG. 2, the organic light emitting layer OL emitting white W can have a single-stack structure. The single-stack structure includes an emission layer EML and can further include at least one of common layers such as a hole injection layer HIL, a hole transport layer HTL, an electron transport layer ETL, and an electron injection layer EIL.

Since the above-described organic light emitting layer OL, in particular, the hole injection layer HIL is widely formed so as to cover all the pixels without being patterned for each pixel PXL, some current generated when the display device maintains on state can be leaked through the hole injection layer HIL. There arises a problem that a color gamut is significantly decreased as the light is emitted from the pixel PXL in which light emission is not required due to the leakage current.

The above problem is further problematic in a high-resolution display device in which a distance between the pixels PXL is relatively reduced. That is, the neighboring pixels PXL are partitioned by a pixel defining layer such as a bank BN and spaced apart by a predetermined distance. However, since the distance is significantly reduced for the high-resolution display device, an incidence of color mixture defects due to the leakage current is inevitably increased. Therefore, in order to prevent deterioration of display quality in the high-resolution display device, it is necessary to restrict a flow of the leakage current.

In order to solve the above problems, the preferred embodiments of the present disclosure propose a novel bank structure capable of effectively suppressing the leakage current.

First Embodiment

Figure 3:
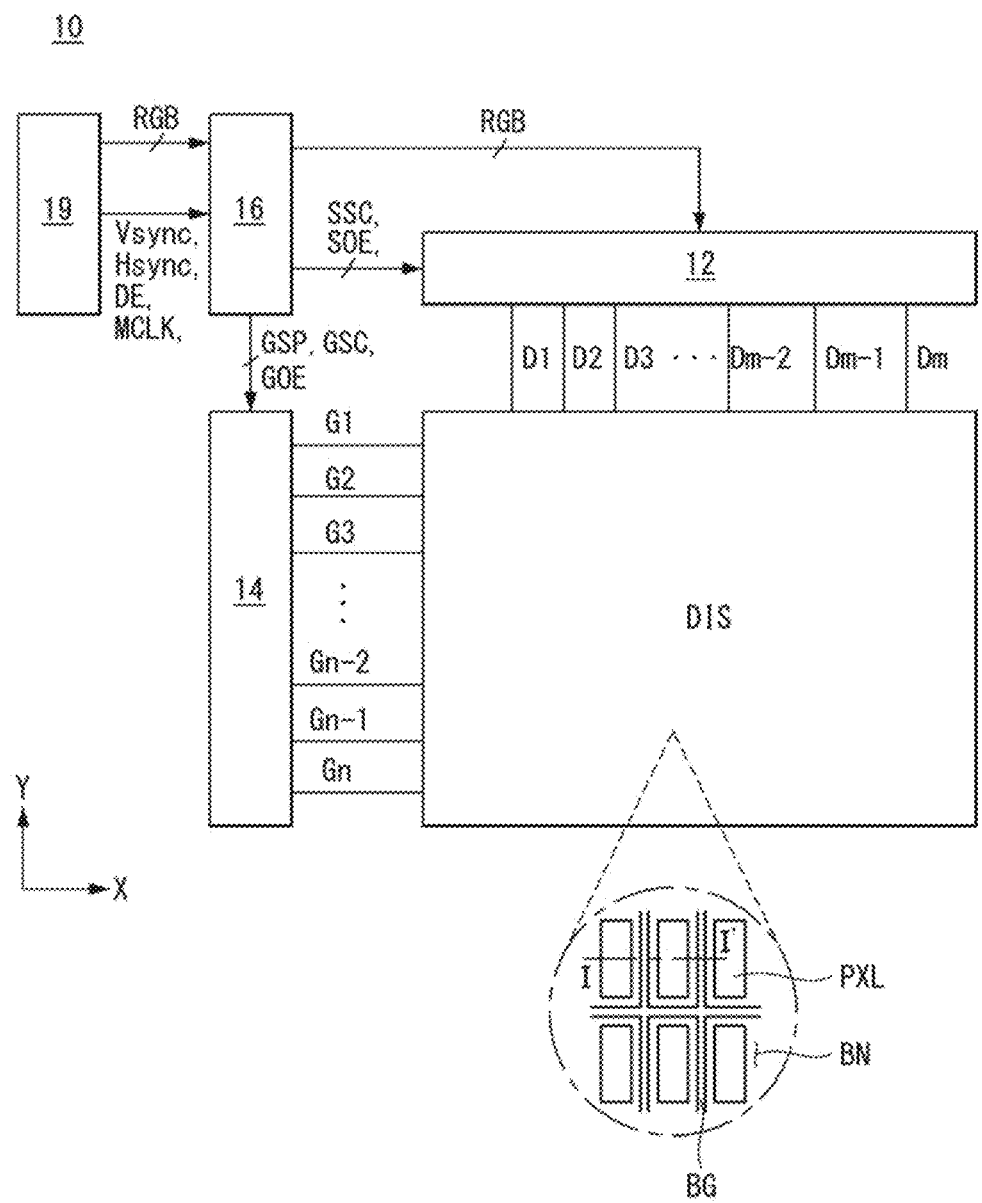
FIG. 3 is a block diagram schematically illustrating an organic light emitting diode display device according to the present disclosure.
Figure 4:
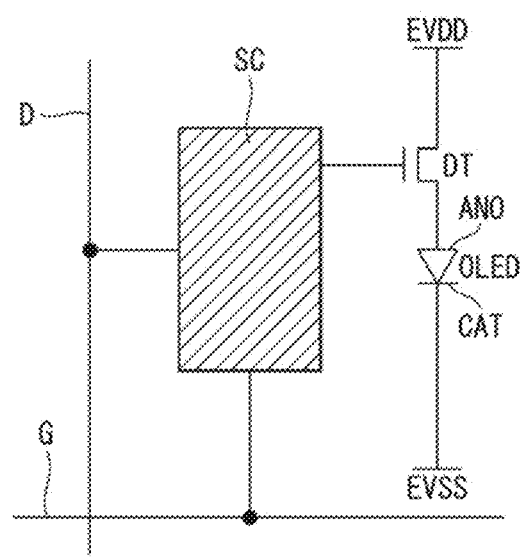
FIG. 4 is a schematic diagram illustrating a pixel shown in FIG. 3.
Figure 5:
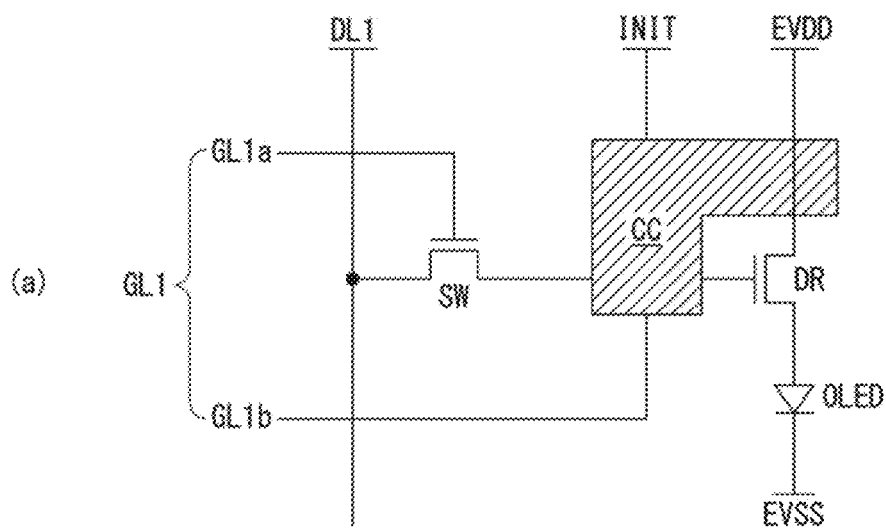
FIG. 5 is a diagram illustrating a specific example of FIG. 4.
Figure 5:
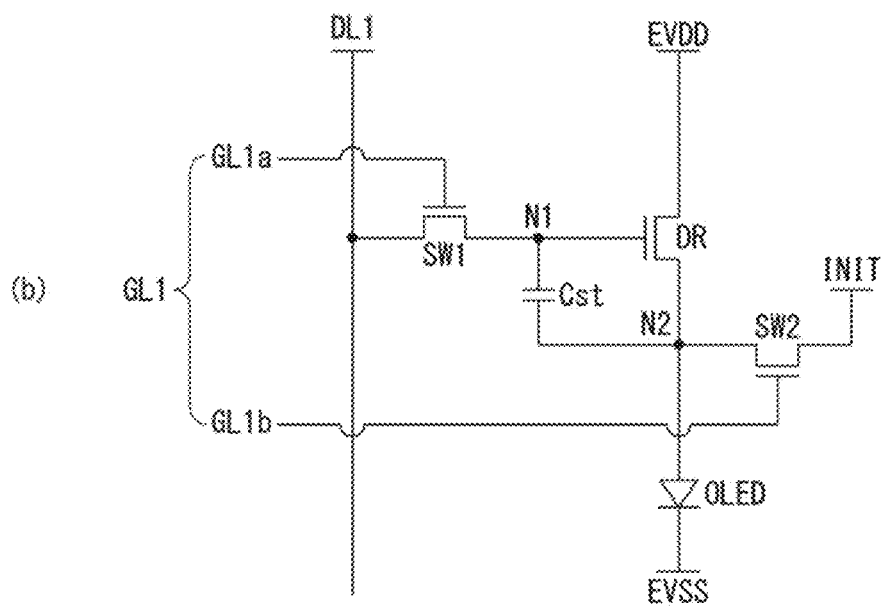
Figure 6:
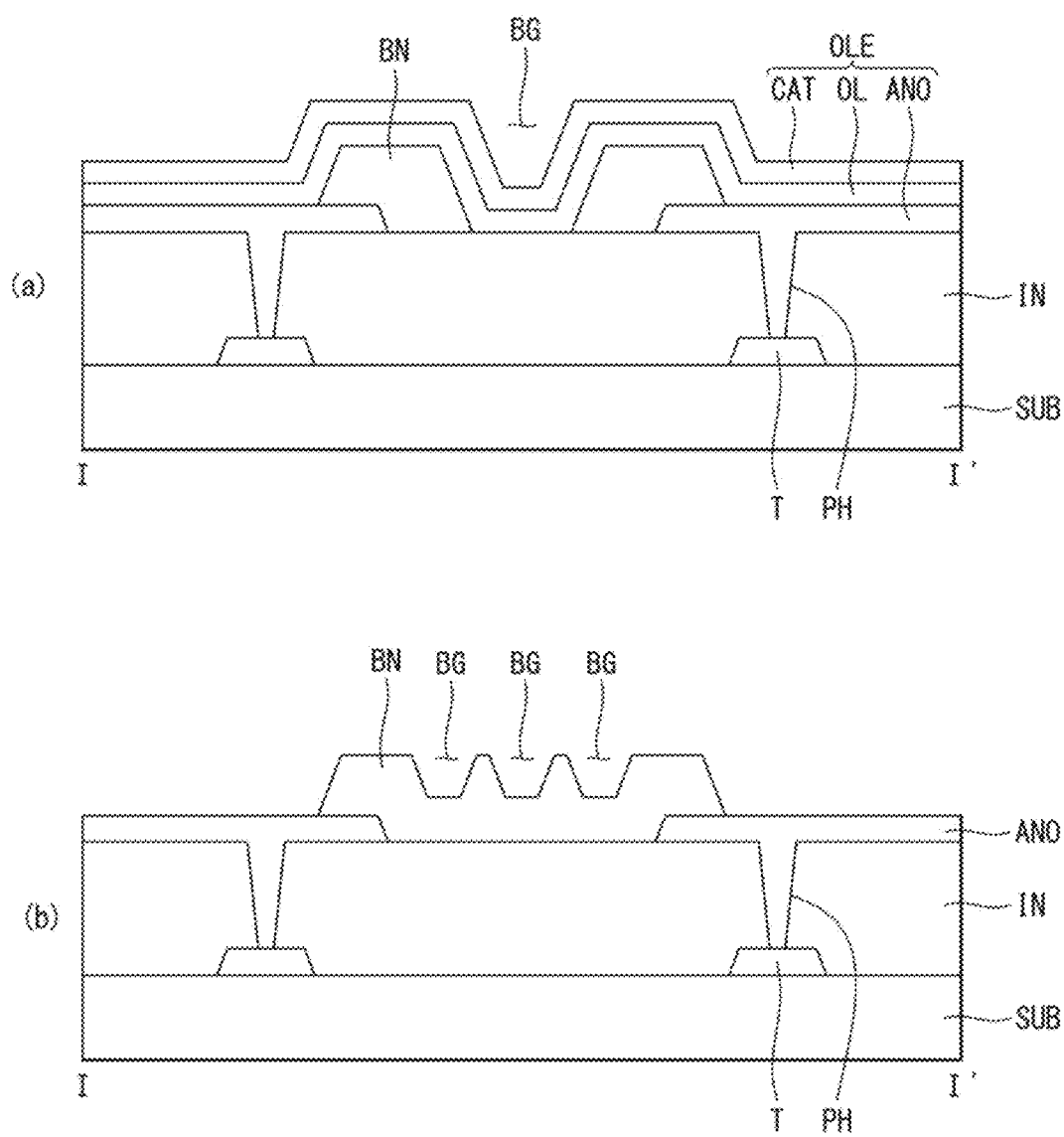
FIG. 6 is a cross-sectional view schematically illustrating an organic light emitting diode display device along line I-I' of FIG. 3 according to a first embodiment of the present disclosure.
Figure 7:
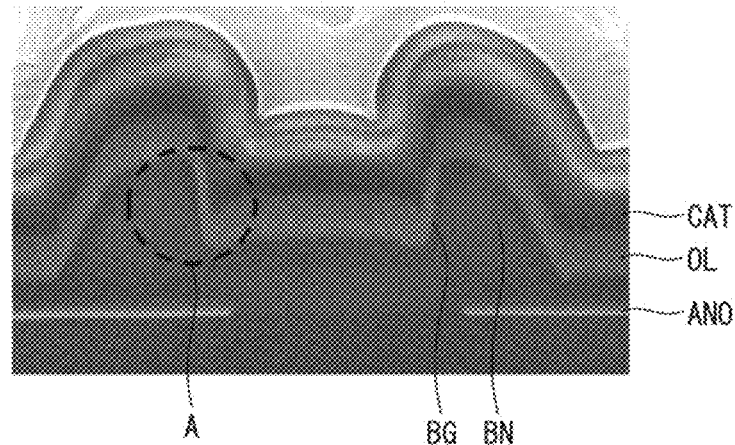
FIG. 7 is a view illustrating a shape of a groove formed in a bank and relationship between a groove and an organic light emitting layer.

FIG. 3 is a block diagram schematically illustrating an organic light emitting diode display device according to a first embodiment of the present disclosure. FIG. 4 is a schematic diagram illustrating a pixel shown in FIG. 3. FIG. 5 is a diagram illustrating a specific example of FIG. 4. FIG. 6 is a cross-sectional view schematically illustrating an organic light emitting diode display device along line I-I' of FIG. 3, according to the first embodiment of the present disclosure. FIG. 7 is a view illustrating a shape of a groove formed in a bank and relationship between a groove and an organic light emitting layer.

Referring to FIG. 3, the organic light emitting diode display device 10 according to the first embodiment of the present disclosure includes a display driving circuit and a display panel DIS.

The display driving circuit includes a data driver 12, a gate driver 14, and a timing controller 16, and writes a video data voltage of an input image to pixels PIX of the display panel DIS. The data driver 12 converts digital video data RGB input from the timing controller 16 into an analog gamma compensation voltage to generate a data voltage. The data voltage output from the data driver 12 is supplied to data lines D1 to Dm. The gate driver 14 sequentially supplies a gate signal synchronized with the data voltage to gate lines G1 to Gn to select the pixels of the display panel DIS to which the data voltage is written.

The timing controller 16 receives a timing signal such as a vertical synchronizing signal Vsync, a horizontal synchronizing signal Hsync, a data enable signal DE and a main clock MCLK, and the like input from a host system 19, and synchronizes operation timing of the data driver 12 and the gate driver 14. Data timing control signal for controlling the data driver 12 includes a source sampling clock SSC, a source output enable signal SOE, and the like. Gate timing control signal for controlling the gate driver 14 includes a gate start pulse GSP, a gate shift clock GSC, a gate output enable signal GOE, and the like.

The host system 19 can be implemented as any one of a television system, a set-top box, a navigation system, a DVD player, a Blu-ray player, a personal computer (PC), a home theater system, and a phone system. The host system 19 includes a system on chip (SoC) with an embedded scaler to convert the digital video data RGB of the input image into a format suitable for displaying on the display panel DIS. The host system 19 transmits the timing signals Vsync, Hsync, DE, and MCLK together with the digital video data to the timing controller 16.

The display panel DIS can have various planar shapes. That is, the display panel DIS can have a rectangular shape, a square shape, or planar shapes of various free forms such as a circle, an ellipse, or a polygon.

The display panel DIS includes a pixel P×L array. The pixel P×L array includes a plurality of pixels PXL. Each of the pixels PXL can be defined by an intersection structure of the data lines D1 to Dm, m is a positive integer, and the gate lines G1 to Gn, n is a positive integer, but it is not limited thereto. Each of the pixels PXL includes an organic light emitting diode (OLED), which is a self light emitting element. The display panel DIS includes red R, blue B, and green G pixels PXL emitting red R, blue B, and green G.

The pixel PXL can have various shapes. That is, the pixel PXL can have various planar shapes such as a circle, an ellipse, and a polygon. Any one of the pixels PXLs can have a different size and/or planar shape from the other.

Referring further to FIG. 4, in the display panel DIS, a plurality of data lines D intersect with a plurality of gate lines G in intersecting areas, and pixels are arranged in a matrix form in each of the intersecting areas. Each of the pixels includes an organic light emitting diode OLED, a driving thin film transistor DT for controlling an amount of a current flowing through the organic light emitting diode OLED, and a programming unit SC for setting a gate-source voltage of the driving thin film transistor DT.

The programming unit SC can include at least one switching thin film transistor and at least one storage capacitor. The switching thin film transistor is turned on in response to a gate signal from the gate line G to apply a data voltage from a data line D to one electrode of the storage capacitor. The driving thin film transistor DT controls the amount of the current supplied to the organic light emitting diode OLED depending on a magnitude of a voltage charged in the storage capacitor to control an amount of light emitted from the organic light emitting diode OLED. The amount of light emitted from the organic light emitting diode OLED is proportional to the amount of the current supplied from the driving thin film transistor DT. Each of the pixels is connected to a high level power source EVDD and a low level power source EVSS, and are supplied with a high level power supply voltage and a low level power supply voltage from a power generator. Thin film transistors constituting a pixel PXL can be implemented as a p-type or an n-type. In addition, a semiconductor layer of the thin film transistors constituting the pixel PXL can include amorphous silicon, polysilicon, or an oxide. Hereinafter, a case where the semiconductor layer includes the oxide will be described as an example. The organic light emitting diode OLED includes an anode electrode ANO, a cathode electrode CAT, and an organic light emitting layer interposed between the anode electrode ANO and the cathode electrode CAT. The anode electrode ANO is connected to the driving thin film transistors DT.

As shown in (a) of FIG. 5, a sub-pixel can include an internal compensation circuit CC as well as a switching transistor SW, a driving transistor DR, a capacitor Cst and the organic light emitting diode OLED described above. The internal compensation circuit CC can include one or more transistors connected to a compensation signal line INIT. The internal compensation circuit CC sets a gate-source voltage of the driving transistor DR to a voltage on which a threshold voltage is reflected, so that it excludes a luminance change due to the threshold voltage of the driving transistor DR when the organic light emitting diode OLED emits light. In this case, a scan line GL1 includes at least two scan lines GL1a and GL1b to control the switching transistor SW and the transistors of the internal compensation circuit CC.

As shown in (b) of FIG. 5, a sub-pixel can include a switching transistor SW1, a driving transistor DR, a sensing transistor SW2, a capacitor Cst, and an organic light emitting diode OLED. The sensing transistor SW2 is a transistor that can be included in the internal compensation circuit CC, and performs a sensing operation for compensation driving of the sub-pixel.

The switching transistor SW1 functions to supply a data voltage supplied through a data line DL1 to a first node N1 in response to a scan signal supplied through a first scan line GL1a. The sensing transistor SW2 functions to initialize or sense a second node N2 disposed between the driving transistor DR and the organic light emitting diode OLED in response to a sensing signal supplied through a second scan line GL1b.

A structure of the pixel of the present disclosure is not limited to this, and can be variously composed of 2T (Transistor) 1C (Capacitor), 3T1C, 4T2C, 5T2C, 6T2C, 7T2C and the like.

Referring to FIG. 6, an organic light emitting diode display device according to a preferred embodiment of the present disclosure includes a thin film transistor substrate SUB. The thin film transistor substrate SUB can be made of glass material, plastic material or silicon material. A thin film transistor T allocated to each of pixels and an organic light emitting diode OLE connected to the thin film transistor T are disposed on the thin film transistor substrate SUB. Neighboring pixels can be partitioned by a bank BN (or a pixel defining layer), and a plane shape of each of the pixels can be defined by the bank BN. Therefore, in order to form the pixels PXL having a predetermined plane shape, position and shape of the bank BN can be appropriately selected.

The thin film transistor T can be implemented in various structures such as a bottom gate, a top gate, and a double gate structure. That is, the thin film transistors T can include a semiconductor layer, a gate electrode, and a source/drain electrode, and the semiconductor layer, the gate electrode, and the source/drain electrode can be disposed on different layers with at least one insulating layer interposed therebetween.

One or more insulating layer IN can be interposed between the thin film transistor T and the organic light emitting diode OLE. The insulating layer IN can include a planarization layer formed of an organic material such as photo acryl, polyimide, benzocyclobutene resin, acrylate resin. The planarization layer can planarize a surface of the substrate SUB on which the thin film transistor T and various signal lines are formed. Although not shown, the insulating layer can further include a protective layer which is made of a silicon oxide film (SiOx), a silicon nitride film (SiNx) or a multilayer thereof, and the protective layer can be interposed between the planarization layer and the thin film transistor T. The thin film transistor T and the organic light emitting diode OLE can be electrically connected through a pixel contact hole PH passing through one or more insulating layer IN.

The organic light emitting diode OLE includes a first electrode ANO, a second electrode CAT opposite to each other, and an organic light emitting layer OL interposed between the first electrode ANO and the second electrode CAT. The first electrode ANO can be an anode, and the second electrode CAT can be a cathode.

The first electrode ANO can be composed of a single layer or a multilayer. The first electrode ANO can further include a reflective layer to function as a reflective electrode. The reflective layer can be made of aluminum (Al), copper (Cu), silver (Ag), nickel (Ni) or an alloy thereof, preferably silver/palladium/copper (APC) alloy. For example, the first electrode ANO can be formed of a triple layer of ITO/Ag/ITO. In this case, the lower ITO can be formed for the purpose of improving adhesion property between an organic layer (the planarization layer) and Ag. The first electrode ANO can be divided to correspond to each of the pixels, respectively, and allocated as one for each of the pixels.

The bank BN for partitioning the neighboring pixels is disposed on the substrate SUB on which the first electrode ANO is formed. The bank BN can be formed of an organic material such as polyimide, benzocyclobutene resin, or acrylate resin. The bank BN includes openings for exposing at least of portion of the first electrode ANO. The portion of the first electrode ANO exposed by the bank BN can be defined as a light emitting area. The bank BN can be disposed to cover a side end of the first electrode ANO while exposing the central portion of the first electrode ANO.

The bank BN includes a groove BG. The groove BG can have a hole shape that completely penetrates an entire thickness of the bank BN and exposes a lower layer ((a) OF FIG. 6) or can have a recess shape that is partially recessed inward from an upper surface of the bank BN ((b) of FIG. 6). The groove BG is disposed between the neighboring pixels in one area. In other words, the grooves BG are disposed between neighboring openings in one area.

The groove BG can function to sufficiently secure a path of a leakage current that can flow to the neighboring pixels. That is, when the groove BG is formed in the bank BN, since a layer (for example, a charge generation layer) that becomes a flow path of the leakage current is also deposited along a stepped portion (or step difference) provided by the groove BG, a relatively long flow path of the leakage current can be secured. Accordingly, the preferred embodiment of the present disclosure can effectively block the leakage current, so that it is possible to prevent a problem that color gamut is remarkably lowered as light is emitted from a pixel for which light emission is not required.

In other words, the preferred embodiment of the present disclosure includes the bank BN in which the groove BG is formed, so that it is possible to relatively increase a surface area of the layer (for example, the charge generation layer) that becomes the path of the leakage current. That is, the preferred embodiment of the present disclosure can increase a resistance by controlling the surface area of the layer (for example, the charge generation layer) that becomes the path of the leakage current. Accordingly, the preferred embodiment of the present disclosure can effectively reduce the flow of the leakage current, so that it has an advantage that color mixture defects due to the leakage current can be minimized. In order to increase the resistance by controlling the surface area, the preferred embodiment of the present disclosure can appropriately select the number of the grooves BG, such as forming a plurality of grooves BG between the neighboring pixels, and appropriately select width and depth of the groove BG. In order to increase the resistance between the neighboring pixels, it is preferable that the groove BG has a hole shape. The plurality of grooves BG can be disposed side by side along one direction between the neighboring pixels in one direction. At this time, a distance between the plurality of grooves BG can differ depending on a position.

In addition, the layer (for example, the charge generation layer) that becomes the path of the leakage current is deposited along the stepped portion provided by the groove BG. When the layer that becomes the path of the leakage current is formed along the stepped portion of the groove BG, it cannot be formed with a uniform thickness on the bank BN and can be formed with a different thickness depending on the position. That is, referring to FIG. 7, it can be seen that the organic light emitting layer OL is formed thinner than other areas in an area A corresponding to a side of the groove BG.

The preferred embodiment of the present disclosure, by providing the groove BG, can have an area in which the thickness of the layer (for example, the charge generation layer) that becomes the path of the leakage current is thinly formed, thereby increasing the resistance relatively. Accordingly, the preferred embodiment of the present disclosure can effectively reduce the flow of the leakage current, so that it has an advantage that the color mixture defects due to the leakage current can be minimized.

The organic light emitting layer OL is formed on the substrate SUB on which the bank BN is formed. The organic light emitting layer OL can be extended to be disposed on the thin film transistor substrate SUB so as to cover the pixels. The organic light emitting layer OL can have a multi-stack structure such as a two stack structure. The two stack structure can include the charge generation layer (CGL) disposed between the first electrode ANO and the second electrode CAT and a first stack and a second stack disposed below and above the charge generation layer, respectively, with the charge generation layer interposed therebetween. The first stack and the second stack each include an emission layer, and can further include at least one of common layers such as a hole injection layer, a hole transport layer, an electron transport layer, and an electron injection layer. The emission layer of the first stack and the emission layer of the second stack can include light emitting materials of different colors.

The second electrode CAT is formed on the substrate SUB on which the organic light emitting layer OL is formed. The second electrode CAT can be formed of a transparent conductive material such as Indium Tin Oxide (ITO), Indium Zinc Oxide (IZO), or Zinc Oxide (ZnO), or can be formed of a thin opaque conductive material such as magnesium (Mg), calcium (Ca), aluminum (Al), or silver (Ag), and can function as a transmitting electrode. The second electrode CAT can be integrally extended to be disposed on the thin film transistor substrate SUB so as to cover the pixels.

Further, since the first embodiment of the present disclosure can effectively reduce the leakage current traveling to the neighboring pixels, it is possible to minimize the problem that unwanted pixels emit light due to the leakage current. Accordingly, the first embodiment of the present disclosure can provide an organic light emitting diode display device having remarkably improved display quality.

Second Embodiment

Figure 8:
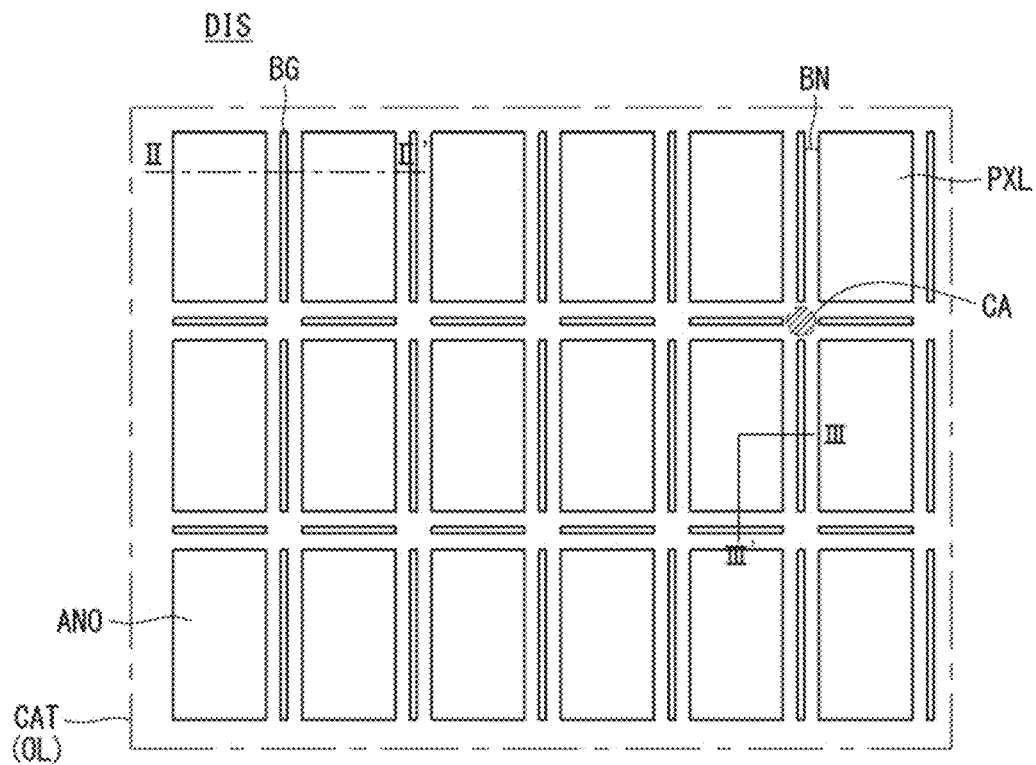
FIG. 8 is a plan view schematically illustrating an organic light emitting diode display device according to a second embodiment of the present disclosure.
Figure 9:
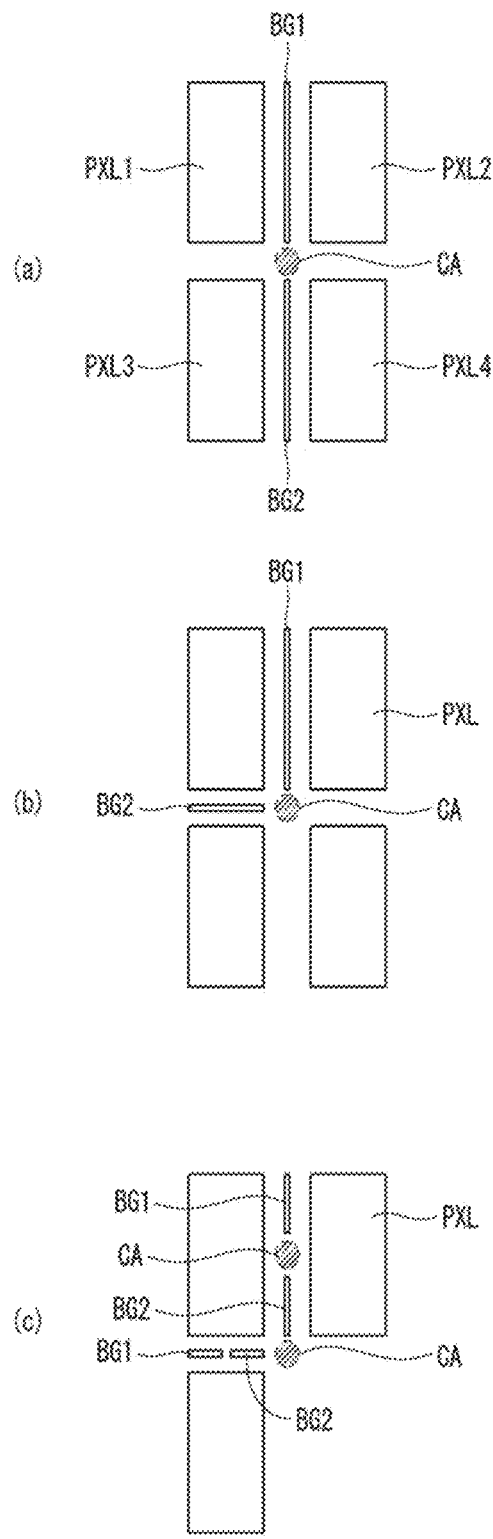
FIG. 9 is a view for explaining an example of an arrangement of grooves.
Figure 10:
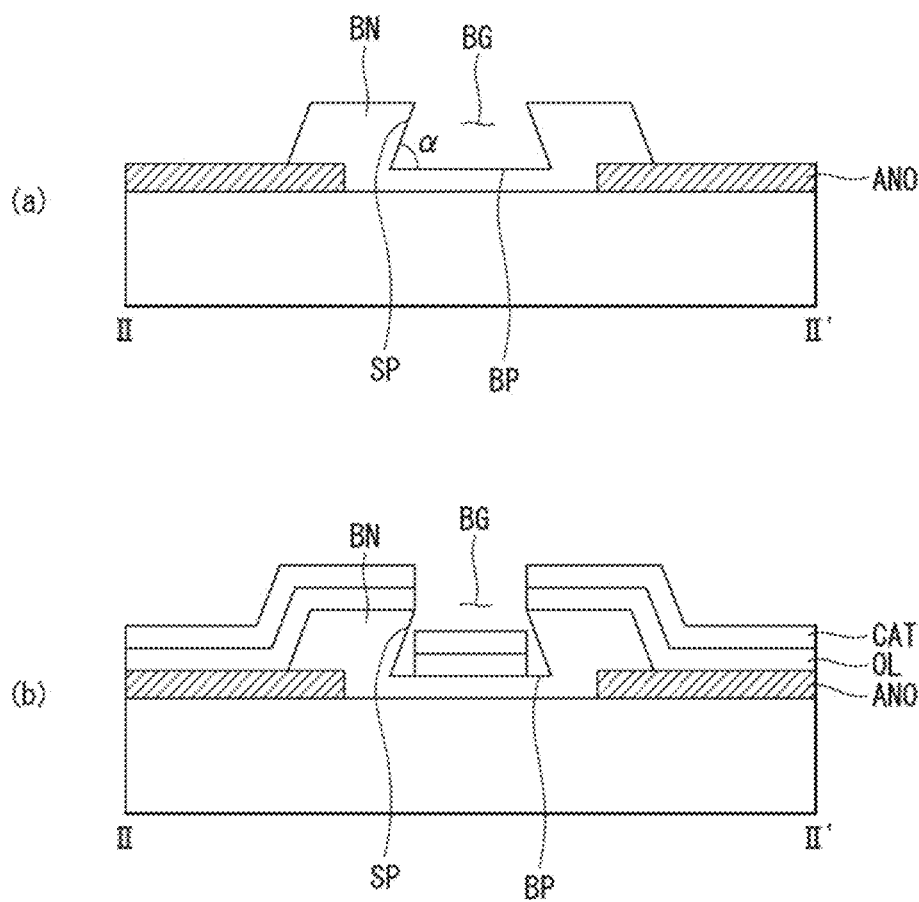
FIGS. 10 and 11 are cross-sectional views schematically illustrating an organic light emitting diode display device along lines II-II' and III-III', respectively, according to the second embodiment of the present disclosure.
Figure 11:
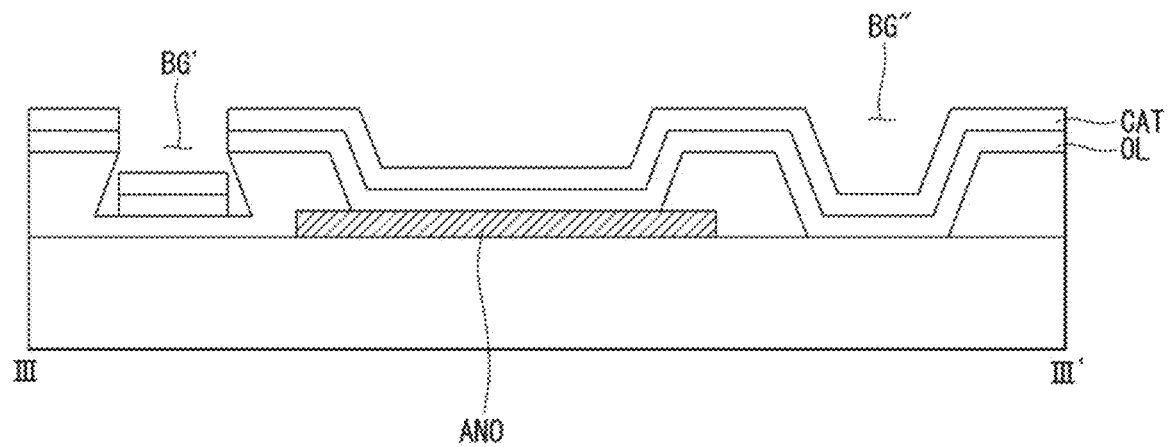

FIG. 8 is a plan view schematically illustrating an organic light emitting diode display device according to a second embodiment of the present disclosure. FIG. 9 is a view for explaining an example of an arrangement of grooves. FIGS. 10 and 11 are cross-sectional views schematically illustrating an organic light emitting diode display device along lines II-II' and III-III', respectively, according to the second embodiment of the present disclosure. In describing the second embodiment of the present disclosure, description of the substantially same structure as that of the first embodiment will be omitted or will be brief.

Referring to FIG. 8, the organic light emitting diode display device according to the second embodiment of the present disclosure includes a display panel DIS having a plurality of pixels PXL. The display panel DIS can have various shapes. That is, the display panel DIS can have a rectangular shape, a square shape, or various free forms such as a circle, an ellipse, or a polygon.

The display panel DIS includes red R, blue B, and green G pixels PXL emitting red R, blue B, and green G, respectively. If necessary, the display panel DIS can further include a pixel PXL that emits a different color such as white W. The pixels PXL each include a thin film transistor and an organic light emitting diode connected to the thin film transistor. The organic light emitting diode includes a first electrode ANO, a second electrode CAT opposite to each other, and an organic light emitting layer OL interposed between the first electrode ANO and the second electrode CAT. The first electrode ANO can be an anode, and the second electrode CAT can be a cathode.

Neighboring pixels PXL can be partitioned by a bank BN (or a pixel defining layer), and a plane shape of each of the pixels can be defined by the bank BN. Therefore, in order to form the pixels PXL having a predetermined plane shape, position and shape of the bank BN can be appropriately selected. The bank BN includes openings, and each of the openings exposes at least a part of the first electrode ANO allocated for each pixel PXL. That is, when viewed in plan, the bank BN is integrally formed, has a plurality of openings, and exposes at least a part of the first electrode ANO through the openings. The exposed first electrode ANO part can be defined as a light emitting area.

The bank BN includes a groove BG. The groove BG can have a hole shape that completely penetrates an entire thickness of the bank BN and exposes a lower layer or can have a recess shape that is partially recessed inward from an upper surface of the bank BN. As described in the first embodiment, a plurality of grooves BG can be disposed between the neighboring pixels PXL. In describing the second embodiment, for convenience of description, a case where only one groove BG is disposed between the neighboring pixels PXL will be described as an example.

The groove BG is configured to reduce a leakage current, and can be selectively provided depending on a position. That is, the groove BG can be selectively provided between the neighboring pixels PXL at a necessary position without being disposed between the neighboring pixels PXL in an entire area.

When the organic light emitting diode display device is implemented in a large area, it cannot maintain a uniform luminance and can cause a luminance deviation depending on the position on an entire surface of an active area where an input image is displayed. More specifically, the second electrode CAT (or the cathode) constituting the organic light emitting diode is formed so as to cover most of a substrate on which the active area is defined. There arises a problem that a power supply voltage applied to the second electrode CAT does not have a uniform voltage value over the entire surface. For example, as a deviation between a voltage value at a lead-in portion and a voltage value at a position apart from the lead-in portion increases, the luminance deviation depending on the position increases.

This problem is more problematic in the top emission display device. That is, in the top emission display device, since it is necessary to secure transmittance of the second electrode CAT which is a transmitting electrode, the second electrode CAT can be formed of a transparent conductive material such as Indium Tin Oxide (ITO) or can be formed of an opaque conductive material having a very thin thickness such as lithium (Li), magnesium (Mg), aluminum (Al), aluminum-lithium (Al—Li), calcium (Ca), magnesium-indium (Mg—In), magnesium-silver (Mg—Ag). In this case, since a sheet resistance of the second electrode is increased due to the characteristics of the material, corresponding to this, the luminance deviation depending on the position is also remarkably increased.

The second embodiment of the present disclosure is characterized by partially separating the second electrode CAT on the active area for the purpose of lowering the sheet resistance of the second electrode CAT in order to prevent the luminance deviation depending on the position. More specifically, the second embodiment of the present disclosure is characterized by physically separating the second electrode CAT at a specific position using the groove BG of the bank BN without performing a separate additional process for patterning the second electrode CAT. The fact that the second electrode CAT is physically separated at the specific position means that continuity of the second electrode CAT at the specific position can not be maintained (or can be limited).

It should be noted, however, that the second electrode CAT is selectively separated at the specific position by the groove BG of the bank BN, but is electrically connected in the entire areas. In other words, the second electrode CAT can be integrally extended to be disposed so as to cover all the pixels and includes a separation area separated by the groove BG and a connection area CA that is connected without being disconnected.

In order to implement this, referring to FIG. 9, the groove BG according to the second embodiment of the present disclosure can be selectively disposed at a specific position as required. The grooves BG can be divided into a plurality of grooves BG, and the divided grooves BG can be spaced apart from each other by a predetermined distance. For example, the groove BG can include a first groove BG1 disposed between neighboring pixels PXL in a first area and a second groove BG2 disposed between neighboring pixels PXL in a second area. The first groove BG1 and the second groove BG2 can be separated from each other without being connected.

In one example, the first area and the second area can be defined between pixels neighboring in the first direction, respectively. In other words, the first groove BG1 can refer to a groove disposed between first and second pixels neighboring in the first direction, and the second groove BG2 can refer to a groove disposed between third and fourth pixels, which are different from the first and second pixels, neighboring in the first direction. (See (a) of FIG. 9).

In another example, any one of the first area and the second area can be defined between pixels neighboring in the first direction (for example, X-axis direction), and the other can be defined between pixels neighboring in a second direction (for example, Y-axis direction) intersecting with the first direction. In other words, the first groove BG1 can refer to a groove disposed between the neighboring pixels in the first direction, and the second groove BG2 can refer to a groove disposed between the neighboring pixels in the second direction ((b) of FIG. 9).

In another example, the first area and the second area can be areas divided in the second direction between pixels neighboring in the first direction, or can be areas divided in the first direction between pixels neighboring in the second direction. In other words, both the first groove BG1 and the second groove BG2 can refer to grooves disposed between two pixels neighboring in the first direction and physically divided in the second direction. Alternatively, both the first groove BG1 and the second groove BG2 can refer to grooves disposed between two pixels neighboring in the second direction and physically divided to be disposed in the first direction ((c) of FIG. 9).

The area where the first groove BG1 and the second groove BG2 are formed can correspond to the separation area of the second electrode CAT, and the area where the first groove BG1 and the second groove BG2 are not formed can correspond to the connection area of the second electrode CAT. Each of the pixels PXL is not electrically isolated and can be supplied with a power supply voltage through the second electrode CAT by including the connection area.

More specifically, referring to (a) of FIG. 10, the bank BN includes the groove BG. A shape of the groove BG can be defined by a bottom surface BP and two sides SP extending from both ends of the bottom surface BP. The second embodiment of the present disclosure physically separates the organic light emitting layer OL and the second electrode CAT disposed on the bank BN using a stepped portion provided by the groove BG. A part of the separated organic light emitting layer OL and a part of the separated second electrode CAT remain in the groove BG as shown in (b) of FIG. 10.

The second embodiment of the present disclosure can select the shape of the groove BG as a predetermined shape in order to separate the organic light emitting layer OL and the second electrode CAT. For example, an angle α (or, a minor angle) between the bottom surface BP and the side SP constituting the groove BG can be set to an acute angle in order to separate the organic light emitting layer OL and the second electrode CAT.

Further referring to FIG. 11, a cross-sectional shape of the groove BG can be different depending on the position. For example, a groove BG' positioned in the first area can have a cross-sectional shape of a reverse taper, and a groove BG" positioned in the second area can have a cross-sectional shape of a taper. That is, an angle formed by the bottom surface and the side surface of the groove BG' positioned in the first area can be set to an acute angle, and an angle formed by the bottom surface and the side surface of the groove BG" positioned in the second area can be set to an obtuse angle.

The second embodiment of the present disclosure selectively separates the second electrode CAT at some positions, so that it can reduce the sheet resistance of the second electrode CAT. Therefore, the second embodiment of the present disclosure can effectively reduce a low level voltage deviation depending on the position. Accordingly, since the present disclosure can minimize the non-uniformity in luminance, it can provide an organic light emitting display device having improved display quality.

Further, the second embodiment of the present disclosure can separate the organic light emitting layer OL including a layer that becomes a path of the leakage current without additional process. Thus, the second embodiment of the present disclosure can disconnect the path of the leakage current, so that it has an advantage that color mixture defect due to the leakage current can be further minimized.

Third Embodiment

Figure 12:
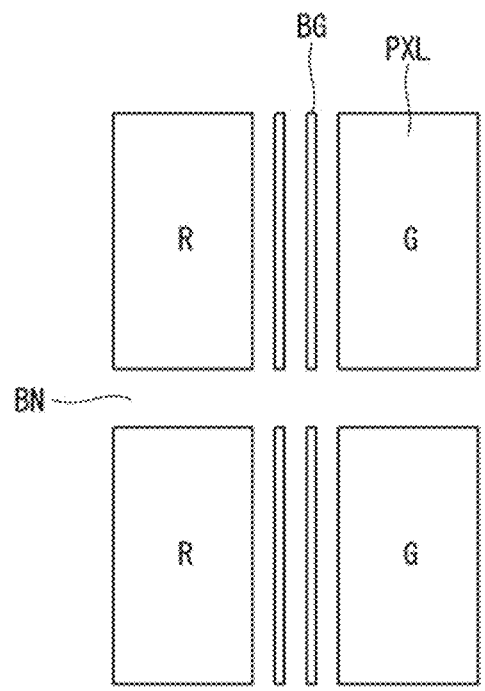
FIGS. 12 and 13 are plan views schematically illustrating an organic light emitting diode display device according to a third embodiment of the present disclosure.
Figure 13:
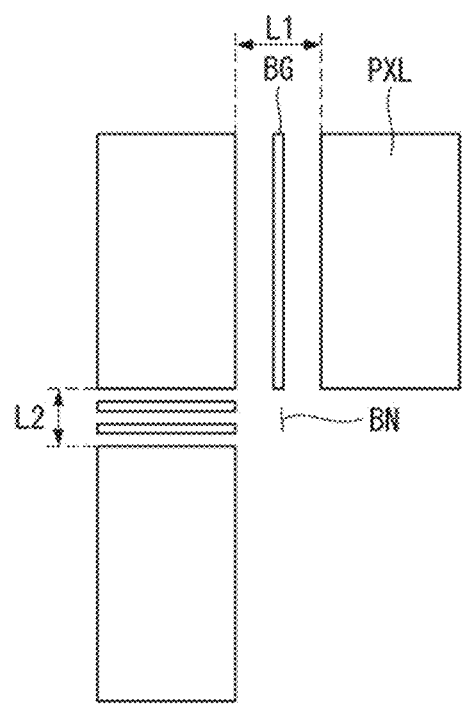

FIGS. 12 and 13 are plan views schematically illustrating an organic light emitting diode display device according to a third embodiment of the present disclosure. In describing the third embodiment of the present disclosure, description of the substantially same components as those of the first and second embodiments will be omitted or will be brief.

The organic light emitting diode display device according to the third embodiment of the present disclosure includes a display panel having a plurality of pixels PXL. The display panel includes red R, blue B, and green G pixels PXL emitting red R, blue B, and green G, respectively. If necessary, the display panel can further include a pixel PXL that emits a different color such as white W. The pixels PXL each include a thin film transistor and an organic light emitting diode connected to the thin film transistor.

Neighboring pixels PXL can be partitioned by a bank BN (or a pixel defining layer), and a plane shape of each of the pixels can be defined by the bank BN. Therefore, in order to form the pixels PXL having a predetermined plane shape, position and shape of the bank BN can be appropriately selected.

The bank BN includes a groove BG. The groove BG can have a hole shape that completely penetrates an entire thickness of the bank BN and exposes a lower layer or can have a recess shape that is partially recessed inward from an upper surface of the bank BN. As described in the first embodiment, a plurality of grooves BG can be disposed between the neighboring pixels PXL.

The groove BG is configured to reduce a leakage current, and can be selectively provided depending on a position. That is, the groove BG can be selectively provided between the neighboring pixels PXL at a necessary position without being disposed between the neighboring pixels PXL in an entire area.

Referring to FIG. 12, when neighboring pixels PXL are selected as pixels PXL emitting the same color, even if the neighboring pixel PXL emits light unwantedly due to the leakage current, the color mixture defect does not occur. In consideration of this, the third embodiment of the present disclosure can determine whether or not to dispose the groove BG between the neighboring pixels PXL based on the color allocated to the neighboring pixels PXL.

For example, based on a specific pixel PXL emitting red light, a pixel PXL neighboring the specific pixel PXL in the first direction can be allocated to a green G pixel PXL, and a pixel PXL neighboring the specific pixel PXL in the second direction can be allocated to a red R pixel PXL. Here, at least one groove BG is formed between the specific pixel PXL and the green pixel PXL to sufficiently secure a flow path of a leakage path. The groove BG can not be formed between the specific pixel PXL and the red pixel PXL. In this case, it is sufficient to form the groove BG only in a necessary area, which is advantageous in securing a degree of process freedom. In addition, in the area where the groove BG is not formed, a width of the bank BN is formed to be relatively narrow, and an aperture ratio can be secured correspondingly.

Referring to FIG. 13, a distance between neighboring pixels PXL can be different depending on a position. As described above, since the pixels PXL of the present disclosure can have various shapes, an arrangement of the pixels PXL can also be varied, and accordingly, the distance between the neighboring pixels PXL can vary depending on the position.

For example, a spacing distance L1 between the neighboring pixels PXL in a first area and a spacing distance L2 between the neighboring pixels PXL in a second area can be different. Since the flow path of the leakage current can be relatively long in the first area where the spacing distance L1 between the pixels PXL is long, the first area can have a relatively small number of grooves BG as compared with the second area, or can not have the groove BG. For example, the third embodiment of the present disclosure can determine whether or not the grooves BG are formed and the number of the grooves BG corresponding to the spacing distance L1, L2 between the neighboring pixels PXL.

Since the present disclosure can effectively block the leakage current by including the groove formed in the bank, it is possible to prevent a problem that the color reproduction rate is remarkably lowered as light is emitted from the pixel for which the light emission is not required. Accordingly, the present disclosure can provide the organic light emitting diode display device with remarkably improved display quality.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An organic light emitting diode display device comprising:
    pixels including an organic light emitting diode; and
    a bank partitioning the pixels which are neighboring, and having openings exposing at least a portion of a first electrode of the organic light emitting diode allocated for each of the pixels,
    wherein the bank includes at least one groove provided between the neighboring pixels in at least one area,
    wherein the at least one groove includes:
        a first groove disposed between neighboring pixels in a first area; and
        a second groove disposed between neighboring pixels in a second area,
    wherein the first groove and the second groove are separated from each other,
    wherein the first groove is disposed between pixels neighboring in a first direction,
    wherein the second groove is disposed between pixels neighboring in a second direction that intersects with the first direction, wherein a second electrode of the organic light emitting diode includes a connection area which is not physically separated by the at least one groove and which continues in continuity, wherein the first groove is divided into a first portion and a second portion separated from the first portion of the first groove, and the second groove is divided into a first portion and a second portion separated from the first portion of the second groove, wherein the connection area of the second electrode is disposed between the first and second portions of the first groove or between and between the first and second portions of the second groove, and wherein the connection area of the second electrode is disposed between centers of the pixels neighboring in the first direction and between centers of the pixels neighboring in the second direction.

2. The organic light emitting diode display device of claim 1, wherein the at least one groove has either a hole shape that completely penetrates an entire thickness of the bank or a recess shape that is partially recessed inward from an upper surface of the bank.

3. The organic light emitting diode display device of claim 1, wherein the first and second portions of the first groove are disposed in the first area, and the first and second portions of the second groove are disposed in the second area.

4. The organic light emitting diode display device of claim 1, wherein the organic light emitting diode includes:
an organic light emitting layer covering the pixels; and
a second electrode covering the organic light emitting layer,
wherein the organic light emitting layer and the second electrode include at least one area physically separated by the at least one groove.

5. The organic light emitting diode display device of claim 4, wherein a part of the organic light emitting layer and the second electrode physically separated by the at least one groove remains in the at least one groove.

6. The organic light emitting diode display device of claim 4, wherein a shape of the at least one groove is defined by a bottom surface and two sides extending from both ends of the bottom surface, and
wherein an angle between the bottom surface and one of the two sides is an acute angle.

7. The organic light emitting diode display device of claim 6, wherein the at least one groove includes a width and a length greater than the width, and.
wherein the width of the at least one groove is greater than a depth of the at least one groove.

8. The organic light emitting diode display device of claim 1, wherein the connection area is further disposed between four adjacent corners respectively corresponding to four adjacent pixels.

9. An organic light emitting diode display device comprising:
pixels including an organic light emitting diode; and
a bank partitioning the pixels which are neighboring, and having openings exposing at least a portion of a first electrode of the organic light emitting diode allocated for each of the pixels,
wherein the bank includes at least one groove provided between the neighboring pixels in at least one area,
wherein the pixels include:
a first pixel;
a second pixel neighboring the first pixel in a first direction, and an edge of the second pixel spaced apart from a first edge of the first pixel by a first distance; and
a third pixel neighboring the first pixel in a second direction intersecting with the first direction, and an edge of the third pixel spaced apart from a second edge of the first pixel by a second distance shorter than the first distance,
wherein a number of grooves disposed between the first pixel and the second pixel is smaller than a number of grooves disposed between the first pixel and the third pixel.

10. The organic light emitting diode display device of claim 9, wherein the pixels includes red, green and blue pixels,
wherein the organic light emitting diode includes an anode electrode, an organic light emitting layer on the anode electrode and a cathode electrode on the organic light emitting layer, and
wherein the organic light emitting layer of each of the red, green and blue pixels emits a white light.

11. The organic light emitting diode display device of claim 10, further comprising color filters of the red, green and blue pixels implementing red, green and blue lights, respectively, using the white light emitted from the organic light emitting layer.

* * * * *